United States Patent
Chu et al.

(10) Patent No.: US 9,514,797 B1
(45) Date of Patent: Dec. 6, 2016

(54) HYBRID REFERENCE GENERATION FOR FERROELECTRIC RANDOM ACCESS MEMORY

(71) Applicant: Cypress Semiconductor Corporation, San Jose, CA (US)

(72) Inventors: Fan Chu, Colorado Springs, CO (US); Shan Sun, Monument, CO (US); Alan D DeVilbiss, Colorado Springs, CO (US); Thomas Davenport, Denver, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/179,070

(22) Filed: Jun. 10, 2016

Related U.S. Application Data

(60) Provisional application No. 62/302,922, filed on Mar. 3, 2016.

(51) Int. Cl.
*G11C 11/22* (2006.01)
*H01L 27/115* (2006.01)

(52) U.S. Cl.
CPC .......... *G11C 11/2273* (2013.01); *G11C 11/221* (2013.01); *G11C 11/2253* (2013.01); *H01L 27/11507* (2013.01); *H01L 27/11509* (2013.01)

(58) Field of Classification Search
CPC .......... G11C 11/2273; G11C 11/2253; G11C 11/221; H01L 27/11507; H01L 27/11509
USPC .......... 365/145, 189.09, 207, 210.1
See application file for complete search history.

(56) References Cited

U.S. PATENT DOCUMENTS

| | | | | |
|---|---|---|---|---|
| 5,805,495 | A * | 9/1998 | Kimura | G11C 11/5657 365/117 |
| 5,849,832 | A * | 12/1998 | Virnelson | C03C 27/10 524/487 |
| 5,969,982 | A * | 10/1999 | Koo | G11C 11/22 365/145 |
| 6,111,777 | A * | 8/2000 | Ogiwara | G11C 11/22 365/145 |
| 6,191,971 | B1 * | 2/2001 | Tanaka | G11C 11/22 365/145 |
| 6,198,652 | B1 * | 3/2001 | Kawakubo | G11C 11/22 257/295 |
| 6,275,408 | B1 * | 8/2001 | Aoki | G11C 11/22 365/145 |
| 6,819,601 | B2 | 11/2004 | Eliason et al. | |
| 6,898,104 | B2 | 5/2005 | Ogiwara et al. | |
| 7,046,541 | B2 | 5/2006 | Ogiwara et al. | |
| 7,193,880 | B2 | 3/2007 | Madan et al. | |
| 7,729,156 | B2 | 6/2010 | Rodriguez et al. | |

(Continued)

FOREIGN PATENT DOCUMENTS

WO 2016049084 A1 3/2016

OTHER PUBLICATIONS

Ogiwara, R, et al., "A 0.5-/spl mum/m, 3-V 1T1C, 1-Mbit FRAM with a variable reference bit-line voltage scheme using a fatigue-free reference capacitor," Apr. 2000, 1 page, vol. 35, Issue: 4, IEEE Journal of Solid-State Circuits.

*Primary Examiner* — Viet Q Nguyen

(57) ABSTRACT

An apparatus that includes a reference generating circuit configured to generate a reference signal for a non-volatile memory (NVM) device, the reference generating circuit including a first circuit comprising at least one metal-oxide-semiconductor capacitor, the first circuit generating a first signal component of the reference signal, and a second circuit comprising at least one ferroelectric capacitor, the second circuit generating a second signal component of the reference signal, in which the second signal component is temperature dependent.

20 Claims, 12 Drawing Sheets

(56) References Cited

U.S. PATENT DOCUMENTS

| | | | |
|---|---|---|---|
| 2003/0058683 A1* | 3/2003 | Nishihara | H01L 27/11502 365/145 |
| 2004/0266028 A1 | 12/2004 | Rodriguez et al. | |
| 2005/0063213 A1 | 3/2005 | Jacob et al. | |
| 2007/0121404 A1* | 5/2007 | Ogiwara | G11C 5/147 365/210.1 |
| 2010/0110755 A1* | 5/2010 | Hashimoto | G11C 11/22 365/145 |
| 2014/0211533 A1* | 7/2014 | Khanna | G11C 11/221 365/145 |

* cited by examiner

US 9,514,797 B1

HYBRID REFERENCE GENERATION FOR FERROELECTRIC RANDOM ACCESS MEMORY

PRIORITY

The present application claims the priority and benefit under 35 U.S.C. §119(e) of U.S. Provisional Application No. 62/302,922, filed on Mar. 3, 2016, which is incorporated by reference herein in its entirety.

TECHNICAL FIELD

The present disclosure relates generally to a non-volatile (NV) memory device, and more particularly, to reference signal/voltage generation for a ferroelectric random access memory (F-RAM) device.

BACKGROUND

Memory that retains its data even when operation power is not available is classified as nonvolatile memory. Examples of non-volatile memory are nvSRAM, F-RAM, electrically erasable programmable read-only memory (EEPROM), and flash memories. This class of memory may be used in applications in which critical data must be stored after power is removed, or when power is interrupted during operation.

Reference voltage for a memory device or cell may be interpreted as a voltage level that separates what is to be considered a data value "0" or a "1" stored, depending on the charge stored/generated in the memory device or cell. In certain embodiments, voltages found on the memory bus below the reference voltage are to be considered a "0" and voltages above the reference voltage are to be considered a "1", or vice versa. In some embodiments, the reference voltage may be kept at a constant level, programmable, or a combination thereof.

In some non-volatile memory devices, such as F-RAM devices, the charge output from ferroelectric capacitors, such as the switching and non-switching terms, may be temperature dependent. Therefore, there are advantages to have the reference voltage programmable or variable such that more accurate read operation of such F-RAM devices may be attainable.

BRIEF DESCRIPTION OF THE DRAWINGS

The present disclosure is illustrated by way of example, and not by way of limitation, in the FIGS. of the accompanying drawings.

DETAILED DESCRIPTION

Figure 1:
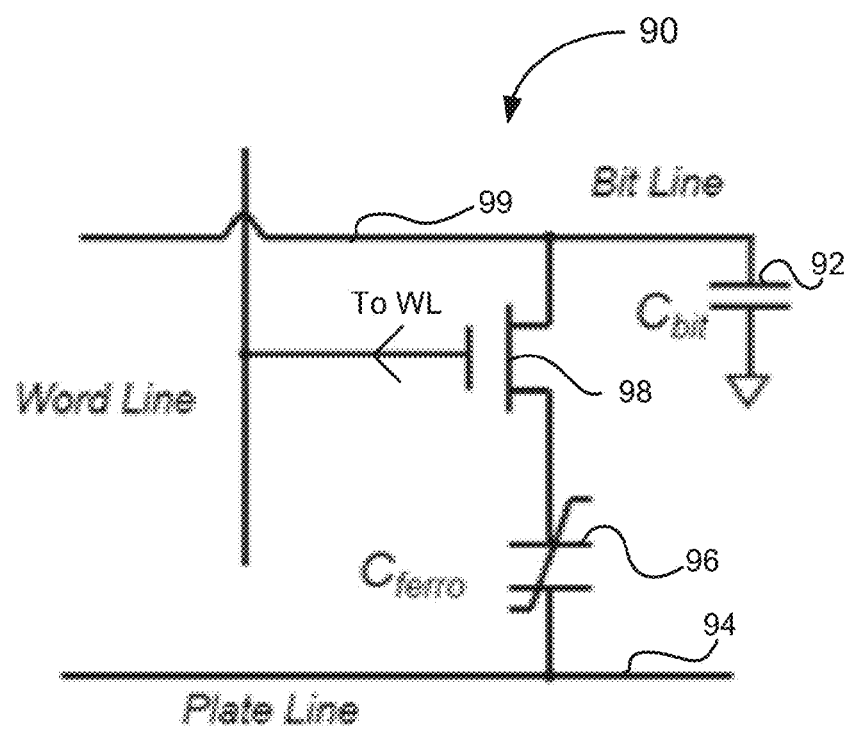
FIG. 1 is a schematic diagram illustrating an one-transistor one-capacitor (1T1C) memory cell in accordance with one embodiment of the subject matter.

The following description sets forth numerous specific details such as examples of specific systems, components, methods, and so forth, in order to provide a good understanding of several embodiments of the subject matter. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the subject matter.

It is a common practice for computers and other processing devices to store information or programs which have been developed or updated in NV memory, such as flash memory, EEPROM, F-RAM, so that in the event of a power outage or a mistake, data can be retrieved.

Summary of Embodiments:

A reference generating circuit that is configured to generate a reference signal for a non-volatile memory (NVM) device, the reference generating circuit including a first circuit that has one or multiple metal-oxide-semiconductor capacitor (MOS capacitor) to generate a first signal component of the reference signal, and a second circuit that has one or multiple ferroelectric capacitor to generate a second signal component of the reference signal. In one embodiment, the second signal component is temperature dependent. The temperature dependence of the second signal component of the reference signal corresponds with the temperature characteristics of the NVM device. The first and second circuits may be coupled in parallel, configured to generate the reference signal cumulatively. In one embodiment, the first and second signals are programmable by a plurality of switches, respectively. In one embodiment, the second circuit includes a ferroelectric capacitor array, the ferroelectric capacitor array has at least one ferroelectric capacitor. In one embodiment, multiple ferroelectric capacitors may be connected in parallel, and the second signal component is programmable by a plurality of switches. In another embodiment, the second circuit includes a plurality of ferroelectric capacitor arrays, and each of the ferroelectric capacitor array has at least one ferroelectric capacitor. In one embodiment, multiple ferroelectric capacitors may be coupled in parallel, and wherein each of the ferroelectric capacitor array is coupled to one another in parallel, and the second signal component is programmable by a plurality of switches. The NVM device may be a ferroelectric random access memory (F-RAM) device including at least one memory ferroelectric capacitor that has a one-transistor-one-capacitor (1T1C) configuration. One of the plurality of memory ferroelectric capacitors of the F-RAM device and at least one ferroelectric capacitor of the second circuit may have approximately the same size, and/or similar structural features. The first signal component of the reference signal may be generated by charge sharing of the at least one MOS capacitor, and the second signal component may be generated by charge sharing of the at least one ferroelectric capacitor. In one embodiment, the second signal component of the reference signal may be configured to be approximately equal to a non-switch term (U term) signal of the plurality of memory ferroelectric capacitors of the F-RAM device as a function of temperature, and the first signal component of the reference signal may be relatively temperature independent and configured to provide an approximately constant margin between the reference signal of the reference circuit and the U term signal of the F-RAM device. The output of the first signal component of the reference signal may be controlled by a first pass transistor, a gate of the first pass transistor may be configured to be coupled to a read word-line signal, and the output of the second signal component of the reference signal may be controlled by a second pass transistor, a gate of the second pass transistor may be configured to be coupled to a ferroelectric word-line signal. In one embodiment, the output signal of the NVM device may be configured to be coupled as a first input of a sense amplifier, and the reference signal may be configured to be coupled as a second input of the sense amplifier. In one embodiment, the plurality of switches may be configured to program a first quantity of the at least one MOS capacitor to generate the first signal component by charge sharing, and a second quantity of the at least one ferroelectric capacitor to generate the second signal component by charge sharing.

In one embodiment, an operation method includes the step of providing a reference generating circuit that has a first circuit comprising at least one MOS capacitor, and a second circuit comprising at least one ferroelectric capacitor, coupling the first and second circuits in parallel. It is followed by the steps of generating, by the first circuit, a first signal component by charge sharing, generating, by the second circuit, a second signal component by charge sharing. Then, it is followed by the steps of generating a reference signal by incorporating the first and second signal components, coupling the reference signal as a first input to a sense amplifier, coupling a signal output of an NVM device as a second input to the sense amplifier. It is then followed by the step of outputting, by the sense amplifier, a first data value of the NVM device if the reference signal is greater than the signal output of the NVM device, and a second data value if the reference signal is smaller than the signal output of the NVM device. In one embodiment, the NVM device includes a ferroelectric random access memory (F-RAM) comprising a 1T1C configuration. The method may also include the steps of pre-charging the at least one MOS capacitor and the at least one ferroelectric capacitor to a pre-charge voltage, programming the at least one MOS capacitor and ferroelectric capacitor, using a plurality of switches, such that the second signal component resembles a non-switching term (U term) signal of the F-RAM as a function of temperature, and the first signal component provides a temperature independent margin between the reference signal and the U term signal, and configuring the magnitude of the pre-charge voltage.

In one embodiment, a memory system includes a processing element, a memory portion including multiple 1T1C F-RAM cells arranged in rows and columns, a hybrid reference generator that further includes a MOS circuit including at least one MOS capacitor, wherein the MOS circuit generating a first signal component of a reference signal does not vary significantly as a function of temperature. The memory portion further includes a ferroelectric circuit including at least one ferroelectric capacitor, the ferroelectric circuit generating a second signal component of the reference signal that may be temperature dependent. The memory system further includes multiple bit-lines in which the 1T1C F-RAM cells of a same column share one of the bit-lines, and a sense amplifier coupled to the 1T1C F-RAM cells via the bit-lines. In one embodiment, the sense amplifier is configured to receive signal outputs of the 1T1C F-RAM cells as a first input and the reference signal from the hybrid reference generator as a second input. In one embodiment, the ferroelectric capacitors of the ferroelectric circuit are disposed in a periphery area of the memory portion in which the at least one ferroelectric capacitor may be similar to memory ferroelectric capacitors in the 1T1C F-RAM cells. In another embodiment, the ferroelectric capacitors of the ferroelectric circuit are disposed adjacent to the MOS circuit in which the ferroelectric capacitors replace some of the MOS capacitors to preserve die area.

Embodiments of a hybrid reference voltage generating circuit for ferroelectric capacitor based memory devices, and methods of operating the same, which allow incorporation of a temperature dependent component to the generated reference voltage, will now be described with reference to the accompanying drawings. The drawings described are only schematic and are non-limiting. In the drawings, the size of some of the elements may be exaggerated and not drawn to scale for illustrative purposes. The dimensions and the relative dimensions may not correspond to actual reductions to practice of the subject matter. For purposes of clarity, many details of input devices and methods of operation in general, and in particular, which are widely known and not relevant to the present apparatus and method have been omitted from the following description.

FIG. 1 is a schematic diagram illustrating one-transistor one-capacitor (1T1C) ferroelectric random access memory (F-RAM) cell 90 in accordance with one embodiment of the subject matter. In one embodiment, 1T1C F-RAM cell 90 may include a non-volatile element, such as ferroelectric capacitor (F-RAM ferroelectric capacitor) 96, n-channel or p-channel pass field-effect transistor (pass transistor) 98, and bit-line capacitor 92 which may be a metal-oxide-semiconductor (MOS) capacitor or simply parasitic capacitance. F-RAM ferroelectric capacitor 96 may include a structure of a ferroelectric layer disposed between two conducting plates, or other similar embodiments known in the art. In one embodiment, one plate of F-RAM ferroelectric capacitor 96 may be coupled to plate line 94 and the other plate may be coupled to bit-line 99 via the source-drain path of pass transistor 98. The gate of pass transistor 98 may be coupled to word-line 97 and configured to be controlled by the word-line signal. In one embodiment, reading and writing operations of F-RAM cell 90 are executed by programming the plate line signal, bit-line signal, and word-line signal. Consequently, the state of polarity, which represents data value "0" or "1" of F-RAM ferroelectric capacitor 96, may be flipped, maintained, and output according to the desirable stored data value. In certain embodiments, multiple 1T1C F-RAM cells 90 may be arranged in an F-RAM array (not shown in this figure) and each 1T1C F-RAM cell 90 of a same row or column may share a common plate line 94, bit-line 99, and/or word-line 97. In one embodiment, charge generated in F-RAM ferroelectric capacitor 96 during a read operation is output to a sense amplifier (not shown in this figure) to determine whether data stored represents data "0" or "1". It should, however, be appreciated that other types of transistors, such as p-channel FETs, and combinations of different types of transistors, capacitors, resistors may be utilized in some embodiments of the F-RAM cells.

Figure 2:
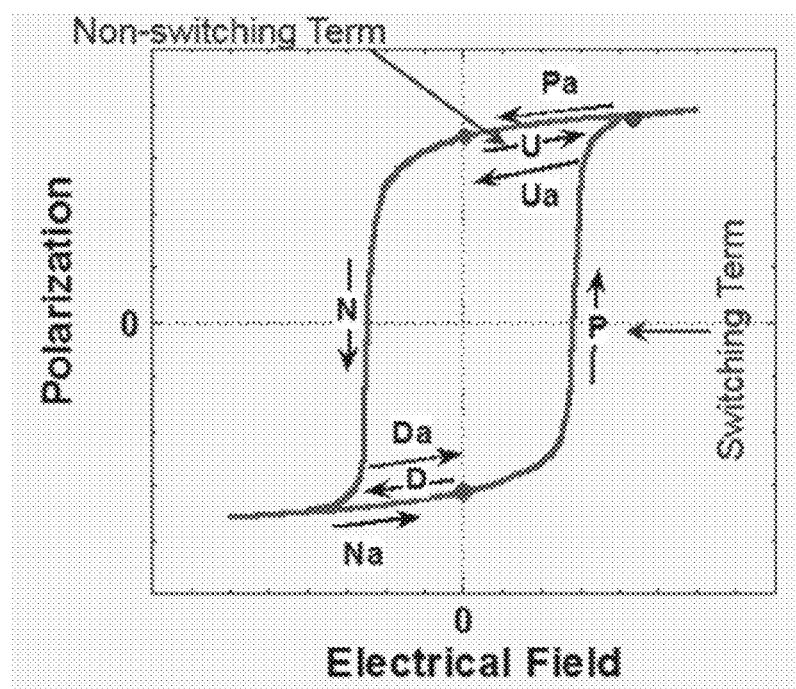
FIG. 2 is a diagram showing the ferroelectric hysteresis loop.

FIG. 2 is a diagram showing the ferroelectric hysteresis loop, which may explain the operation of F-RAM ferroelectric capacitor 96 or similar ferroelectric devices. As shown in FIG. 2, ferroelectric capacitors, such as F-RAM ferroelectric capacitor 96, demonstrate a spontaneous non-zero polarization even when the applied electric field is zero. This distinguishing feature signifies that spontaneous polarization may be reversed or flipped by a suitably strong electric field applied in an opposite direction. The polarization is therefore dependent not only on the currently applied electric field, but also on the current polarity of the ferroelectric capacitor. Non-switching term (U term or U term signal) is the charge generated on F-RAM ferroelectric capacitor 96 when there is no switching of polarization involved after a voltage or electric field is applied thereon. Switching term (P term or P term signal) is the charge generated when there is a switching of polarization. In a 1T1C configuration, U term may represent data "0" and P term may represent data "1", or vice versa in some embodiments. Positive non-switching after term (Ua term or Ua term signal) is the positive charge generated after a voltage or electric field is removed from a ferroelectric capacitor when there is no polarization switching, whereas negative non-switching after term (Da term or Da term signal) is the negative charge generated under the same condition. In the subsequent sections, magnitude of U, P, Ua, and Da term signals may be expressed and compared to other signals in voltage terms.

1T1C F-RAM architecture, which may include only one ferroelectric capacitor, may utilize the P term and U term of the same ferroelectric capacitor in the 1T1C F-RAM cell to represent stored data. Therefore, a 1T1C F-RAM cell may be considered single ended. In contrast, two-transistors two-capacitors (2T2C) F-RAM architecture (not shown) which includes two ferroelectric capacitors, may utilize the P term of one ferroelectric capacitor and the U term of the other ferroelectric capacitor in the same 2T2C F-RAM cell to represent stored data. In one embodiment, 2T2C F-RAM cells may lead to a signal margin that benefits from the full ferroelectric capacitor switching charge (i.e. P term–U term), making the 2T2C F-RAM cell differential. However, a 1T1C F-RAM cell or array, compared to the 2T2C design, may have the advantage of a smaller cell size.

Figure 3:
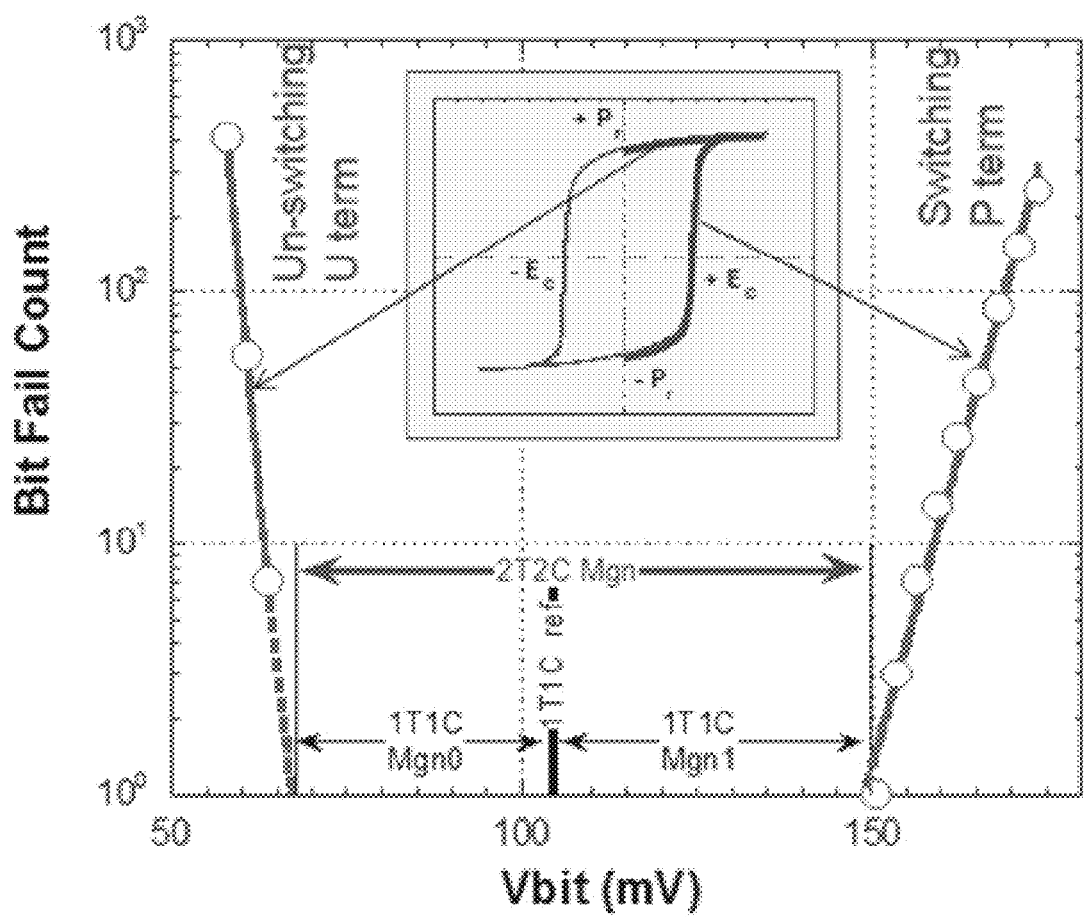
FIG. 3 is a diagram illustrating relationship between F-RAM switching term (P term) and non-switching term (U term), and bit fail count (F-RAM bit distribution)

A reference signal or voltage is a voltage generated internally in an F-RAM device or externally as a reference to differentiate the P term and the U term of ferroelectric capacitors, which in turn represent data "1" and "0" respectively. Since 1T1C F-RAM utilizes the P term and the U term of the same ferroelectric capacitor, a reference voltage may be required to differentiate the two signals. In one embodiment, as illustrated in FIG. 3, a reference voltage is generated within a range between the U term signal and P term signal. Mgn0 is defined as the 1T1C signal margin for data "0", which may be the voltage difference between the reference voltage and U term signal. Mgn1 is defined as the 1T1C signal margin for data "1", which is the voltage difference between P term signal and the reference voltage. It will be the understanding that P term and U term may be reversed to represent "0" and "1" respectively in some embodiments. The 1T1C reference voltage divides the total ferroelectric switching charge into two components or portions, the signal margin for data "0" (Mgn0) and the signal margin for data "1" (Mgn1). Compared with 2T2C design, 1T1C design may include only a maximum of half of the signal margin if the reference voltage is configured perfectly at a half way voltage between P term and U term signals. Therefore, the smaller cell size of 1T1C design may be at the expense of available signal margin. Referring to FIG. 3, U term signal has relatively smaller change over the life of F-RAM devices, 1T1C reference voltage may be set above the U term signal with a fixed offset, which may be equal to Mgn0.

Figure 4:
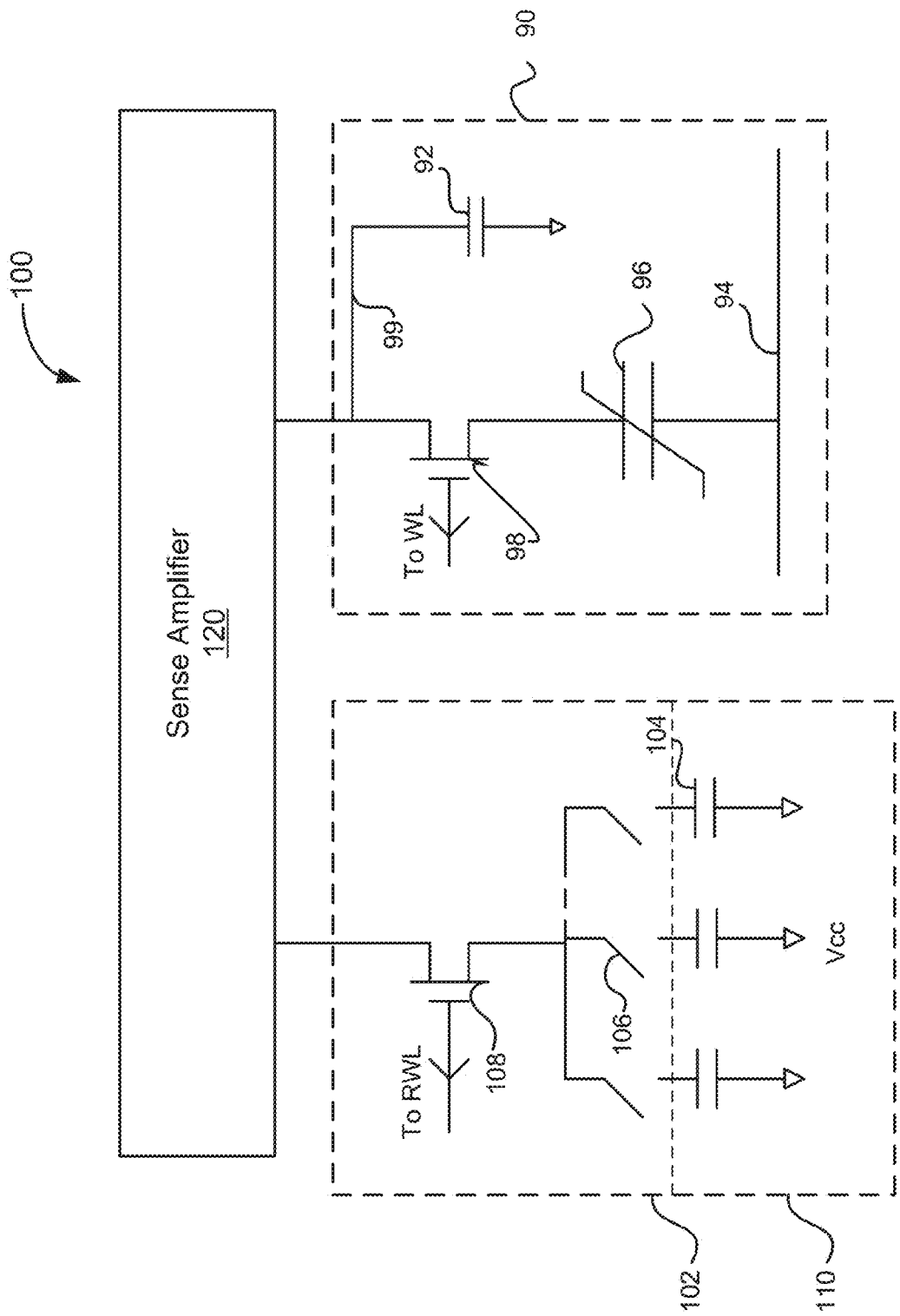
FIG. 4 is a schematic diagram illustrating a portion of an F-RAM device in accordance with one embodiment of the subject matter including a metal oxide semiconductor capacitor (MOS capacitor) reference voltage generating array.

FIG. 4 is a schematic diagram illustrating a portion of F-RAM device 100 including a MOS capacitor reference voltage generating array 102. Referring to FIG. 4, F-RAM device 100 may include 1T1C F-RAM cell 90, which has the 1T1C configuration. It will be the understanding that 1T1C F-RAM device 100 may include multiple 1T1C F-RAM cells 90, wherein each 1T1C F-RAM cell 90 may store one bit of data ("0" or "1"). In some embodiments, F-RAM device 100 may include at least one 2T2C F-RAM cell (not shown in this figure). In one embodiment, F-RAM ferroelectric capacitor 96 is coupled to one input of sense amplifier 120, and thus outputs its signal thereto, via bit-line 99. Pass transistor 98 controls the output signal of F-RAM ferroelectric capacitor 96 and may be programmed by word-line (WL) signal. F-RAM device 100 further includes MOS reference generating circuit 102, which may include MOS capacitor matrix 110. In one embodiment, MOS capacitor matrix 110 includes at least one reference MOS capacitor 104 wherein one plate of each reference MOS capacitor 104 is coupled to switch 106 and the other plate is configured to receive core voltage Vcc, or other appropriate voltages. Multiple reference MOS capacitors 104 may be arranged in parallel and their collective signal output is coupled to a second input of sense amplifier 120. Output of the collective signal of MOS matrix 110 is controlled by read word-line (RWL) signal. In one embodiment, reference MOS capacitors 104 are pre-charged to Vcc, or other appropriate voltages. When a read operation of F-RAM device 100 is initiated, WL and RWL signals respectively turn on pass transistors 98 and 108 in 1T1C F-RAM cell 90 and MOS reference generating circuit 102. In 1T1C F-RAM cell 90, if the polarity state of F-RAM ferroelectric capacitor 96 flips, P term signal will be output to sense amplifier 120. U term signal will be output if the polarity state of F-RAM ferroelectric capacitor 96 remains unchanged. In MOS reference generating circuit 102, reference MOS capacitors 104 are temporarily disconnected from receiving Vcc. Charges accumulated during the pre-charge stage will then be combined to generate 1T1C reference voltage. Signal amplifier 120 is then configured to compare signal output from 1T1C F-RAM cell 90 to 1T1C reference voltage. Data stored in 1T1C F-RAM cell 90 will be considered "0" if 1T1C reference voltage is greater, and "1" if 1T1C reference voltage is smaller. As discussed earlier, 1T1C reference voltage is programmed to be above U term signal with an offset margin (Mgn0). In one embodiment, one approach to program the magnitude of 1T1C reference voltage is to pre-charge only a portion of reference MOS capacitors 104. Another approach is to configure the 1T1C reference voltage is to program switches 106 wherein only a portion of switches 106 are closed during the read operation. In one alternative embodiment, a combination of the two approaches may be adopted. 1T1C reference voltage may be generated by charge sharing among reference MOS capacitors 104 that are programmed and could be utilized for more than one F-RAM cells 90 by averaging out the 1T1C reference voltage. In another alternative embodiment, Vcc or voltages coupled to reference caps 104 may be programmed to control the magnitude of the 1T1C reference voltage. In general, 1T1C reference voltage may be calculated using the following formula: 1T1C reference voltage=Vcc×$C_C/C_T$ where $C_C$ is total capacitance of all MOS capacitors charged to Vcc and $C_T$ is the total capacitance of MOS capacitors that are programmed. In one embodiment, 1T1C reference voltage that is generated by charge sharing of multiple MOS capacitors and may be averaged out for each of the multiple 1T1C F-RAM cells 90.

In general, reference voltage generated by reference generating circuit consists of only MOS capacitors, such as MOS reference generating circuit 102. In one embodiment, the reference voltage generated by MOS-capacitor only circuit may not vary or fluctuate significantly as a function of temperature. It will be the understanding herein and in later sections that the reference voltage generated by MOS capacitors is considered relatively temperature independent. Once the reference generating circuit is programmed, the reference voltage varies or fluctuates insignificantly as a function of operating temperature. For 2T2C F-RAM devices, it may be an advantage that the reference voltage used to determine the signal margin is relatively temperature independent and does not fluctuate significantly as a function of temperature because no temperature factor for the reference voltage may be considered when determining the signal margins at various temperatures. However, for 1T1C F-RAM, such as F-RAM device 100, because of the non-linearity of U term and P term of F-RAM ferroelectric capacitors 96 in 1T1C F-RAM cell 90 as a function of temperature, a relatively temperature independent 1T1C reference voltage may limit the switching term signal margin Mgn1 of the F-RAM device 100 as temperature rises. The loss of Mgn1 may cause false reading of data and pose a major challenge for 1T1C F-RAM devices meeting the temperature requirement, such as being operational at temperature higher than 85° C.

Figure 5:
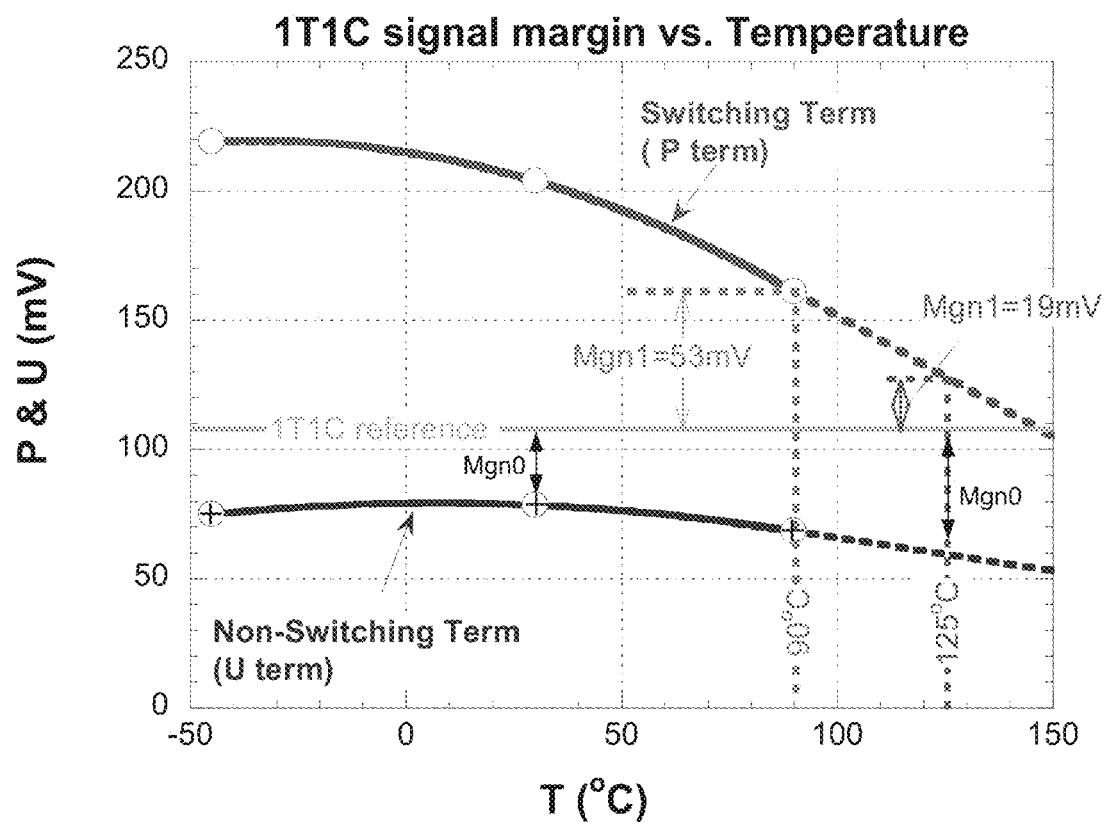
FIG. 5 is a diagram illustrating the relationship of 1T1C reference voltage, P term, and U term as a function of temperature.

FIG. 5 is a diagram illustrating the relationship of 1T1C reference voltage, P term, and U term as a function of temperature. Referring to FIG. 5, the 1T1C reference voltage is generated by a MOS capacitor-only generating circuit, such as MOS reference generating circuit 102 in FIG. 4, which generates signals that may not fluctuate significantly as a function of temperature. However, switching term (P term) signal and non-switching term (U term) signal of F-RAM ferroelectric capacitors 96 in 1T1C F-RAM cell 90 may be temperature dependent, and change as a function of temperature. At temperatures higher than room temperature, P term signal decreases with increasing temperature while U term signal follows a parabolic trend with a maximum value at or around room temperature. At temperatures higher than room temperature, U term signal then decreases with increasing temperature but the decrease may be at a slower rate than the P term signal. As illustrated in FIG. 5, as temperature rises, while Mgn0 may maintain or increase, Mgn1 reduces in an increasing rate. When temperature exceeds a certain threshold, such as 125° C. as illustrated in FIG. 5, Mgn1 may become too small for a sense amplifier to distinguish a P term signal from a U term signal. As a result, the sense amplifier may determine and signify all signals as below the relatively temperature independent 1T1C reference voltage, which is U term (data "0"). FIG. 5 features an example of F-RAM to illustrate this phenomenon. As shown in the example of FIG. 5, the critical or switching term signal margin (Mgn1=53 mV) meets the minimum requirement of 46 mV at 90° C. but becomes too small (Mgn1=19 mV) at 125° C. The decreasing Mgn1 may be one reason that some 1T1C F-RAM devices may not be usable for applications with required temperature ranges greater than 85° C. and may only be specified as operational in industrial temperature range (−45° C. to 85° C.).

Figure 6:
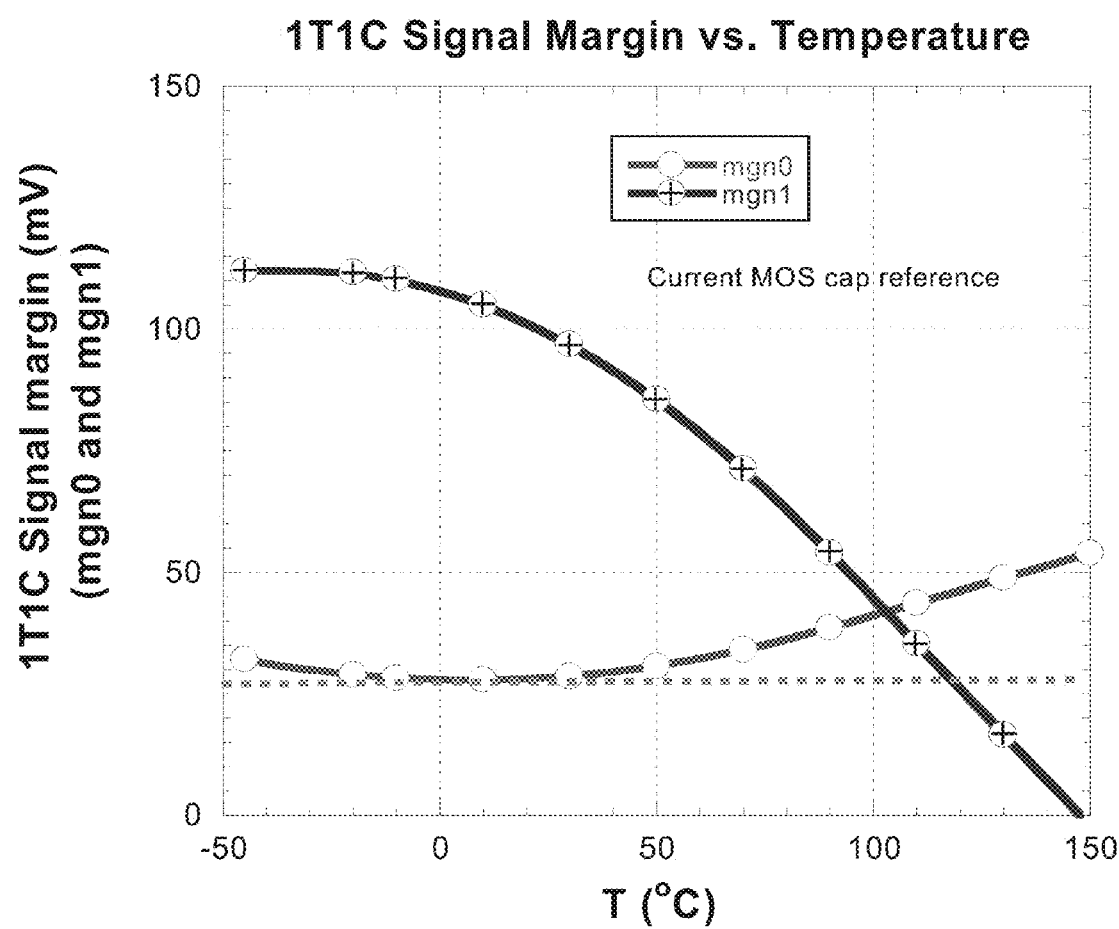
FIG. 6 is a diagram illustrating the relationship of 1T1C F-RAM signal margins as a function of temperature.

FIG. 6 is a diagram illustrating relationship of 1T1C F-RAM signal margins (Mgn0 and Mgn1) derived from FIG. 5 as a function of temperature. As illustrated in FIG. 6, switching term signal margin (Mgn1=P term−1T1C reference voltage) of MOS capacitor-only reference generating circuit decreases quickly with increasing temperature in the range higher than 30° C. For example, at 130° C., Mgn1 is only 16 mV due to the P term degradation of the 1T1C F-RAM at higher temperatures while the relatively temperature independent 1T1C reference signal which is determined for room temperature remains relatively stable. At 150° C., there is no signal margin left on the switching side (Mgn1=0), which may contribute to data reading errors. On the other hand, the non-switching term signal margin (Mgn0=1T1C reference−U) increases with increasing temperature above 30° C. due to the decrease of U term at high temperatures.

As previously illustrated in FIG. 3, U term of F-RAM caps 96, such as those in F-RAM device 100, does not change significantly through their retention life. Referring to FIG. 5, total signal margin (Mgn0+Mgn1) decreases as temperature increases. Therefore, it may be preferable that if 1T1C reference voltage may follow the U term trend of the F-RAM caps 96, as a function of temperature, instead of being relatively constant and not fluctuating significantly as a function of temperature. In other words, 1T1C reference voltage may be variable correspondingly to the temperature characteristics of F-RAM ferroelectric capacitor 96. Moreover, it may prevent Mgn0 from increasing with temperature. The increasing Mgn0 may not add any accuracy for a correct read operation of a U term signal or data "0", but may contribute to an incorrect read operation of a P term signal or data "1". In one embodiment, the temperature dependent 1T1C reference voltage may maximize switching term signal margin (Mgn1), especially at high temperatures, such as over 85° C.

Figure 7:
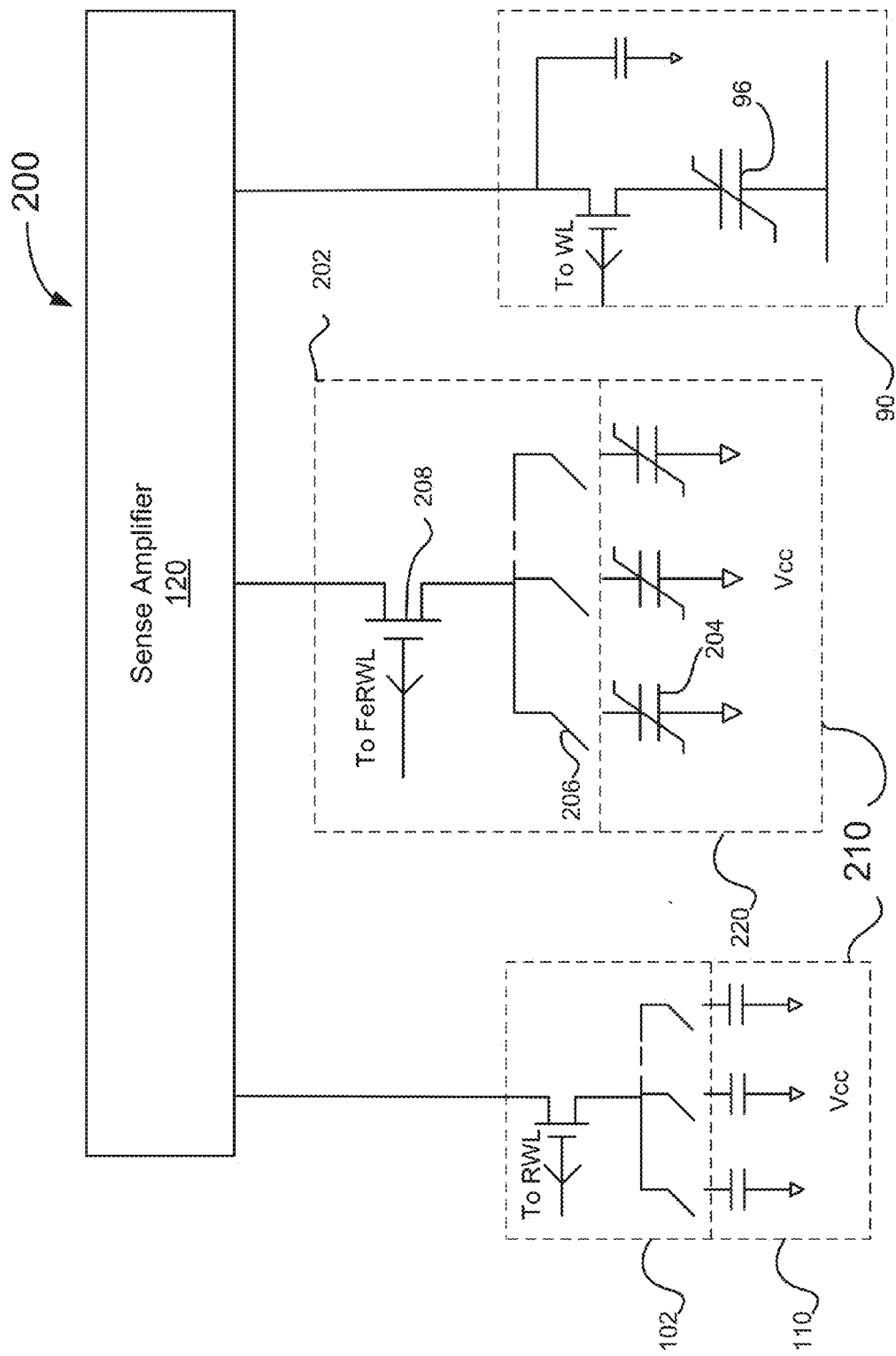
FIG. 7 is a schematic diagram illustrating a portion of an F-RAM device in accordance with one embodiment of the subject matter including a hybrid reference voltage generating array.

FIG. 7 is a schematic diagram illustrating a portion of hybrid F-RAM device 200 including hybrid reference voltage generating array/matrix 210, which may be capable of generating a temperature dependent 1T1C reference signal. Hybrid F-RAM device 200 may have a similar structure as F-RAM device 100 in FIG. 4, which includes sense amplifier 120, 1T1C F-RAM cell 90, and hybrid 1T1C reference voltage generating matrix 210. In one embodiment, hybrid 1T1C reference voltage generating matrix 210 further includes MOS reference generating circuit 102 and ferroelectric reference generating circuit 202. It will be the understanding that hybrid F-RAM device 200 may include multiple 1T1C F-RAM cells 90, and each 1T1C F-RAM cell 90 may store one bit of data ("0" or "1"). In one embodiment, each F-RAM ferroelectric capacitor 96 is coupled to a first input of sense amplifier 120, and thus output its signal thereto, via bit-line 99. Pass transistor 98 controls the output of F-RAM ferroelectric capacitor 96 signal and may be programmed by the word-line (WL) signal. Incorporating hybrid 1T1C reference voltage generating matrix 210 may provide an option for F-RAM device 200 to utilize both MOS reference generating circuit 102 and ferroelectric reference generating circuit 202 to generate a hybrid 1T1C reference voltage.

Referring to FIG. 7, MOS reference generating circuit 102 includes a MOS capacitor matrix 110. In one embodiment, MOS capacitor matrix 110 includes at least one reference MOS capacitor 104, wherein one plate of each reference MOS capacitor 104 is coupled to switch 106 and the other plate is configured to receive core voltage Vcc, or other appropriate voltages. In some embodiments, multiple reference MOS capacitors 104 may be programmed by the same switch 106 (not shown in this figure). Multiple reference MOS capacitors 104 may be arranged in parallel to generate a collective MOS capacitor signal by charge sharing, and their collective signal output may become the MOS component of hybrid 1T1C reference signal. Output of the collective signal of MOS capacitor matrix 110 may be controlled by the read word-line (RWL) signal. In one embodiment, reference MOS capacitors 104 are pre-charged to Vcc, or other pre-determined voltages. When a read operation is initiated, WL and RWL signals turn on pass transistors 98 and 108 in 1T1C F-RAM cell 90 and MOS reference generating circuit 102, respectively. In one embodiment, reference MOS capacitors 104 of MOS reference generating circuit 102 are temporarily disconnected from Vcc. Charges accumulated during the pre-charge stage will then be combined or charge shared to generate the collective MOS capacitor signal, which in turn becomes the MOS component of the hybrid 1T1C reference voltage. In one embodiment, hybrid 1T1C reference signal includes the relatively temperature independent MOS component and the temperature dependent ferroelectric component, which will be discussed in later sections. In one embodiment, the MOS component may provide a relatively constant offset of the hybrid 1T1C reference voltage level, which may be Mgn0, above the non-switching term (U term) of F-RAM ferroelectric capacitor 96 in 1T1C F-RAM cell 90. MOS reference generating circuit 102 is programmable such that the magnitude of the collective MOS capacitor signal may be adjusted to a desirable Mgn0. In one embodiment, F-RAM device 200 is operational at a wide range of temperatures. As discussed, one embodiment to program the magnitude of collective MOS capacitor signal is to pre-charge only a portion of reference MOS capacitors 104 in MOS capacitor matrix 110. Another embodiment to program the collective MOS capacitor signal is to program switches 106 in which only a portion of switches 106 are closed during the read operation. In one alternative embodiment, a combination of the two approaches may be adopted. In another alternative embodiment, Vcc or other voltages coupled to reference MOS capacitors 104 may be configured to control the magnitude of the collective MOS capacitor signal. As temperature rises, total signal margin (P term–U term) of F-RAM ferroelectric capacitor 96 decreases. There may be a point (temperature) where the collective MOS capacitor signal may be adjusted or re-programmed such that F-RAM device 200 continues to be operational. In one embodiment, MOS capacitor matrix 110 having a full set of MOS capacitors may be required in order to determine the true signal margin at different temperatures without introducing variations to hybrid 1T1C reference voltage caused by temperature changes.

Referring to FIG. 7, ferroelectric reference generating circuit 202 includes ferroelectric capacitor matrix 220. In one embodiment, ferroelectric capacitor matrix 220 includes at least one reference ferroelectric capacitor 204, wherein one plate of each reference ferroelectric capacitor 204 is coupled to switch 206 and the other plate is configured to receive core voltage Vcc, or other appropriate voltages. In some embodiments, multiple ferroelectric capacitors 204 may be programmed by the same switch 206. Multiple reference ferroelectric capacitors 204 may be arranged in parallel to generate a collective ferroelectric capacitor signal by charge sharing, and their collective signal output as the ferroelectric component of the hybrid 1T1C reference signal. In one embodiment, the collective ferroelectric capacitor signal is combined with the collective MOS capacitor signal as previously described to generate the hybrid 1T1C reference signal and then is coupled to a second input of sense amplifier 120. Output of the collective signal of ferroelectric capacitor matrix 220 is controlled by ferro read word-line (FeRWL) signal. In one embodiment, the reference ferroelectric capacitors 204 may incorporate a temperature dependent ferroelectric component to the hybrid 1T1C reference signal, which may correspond to the temperature characteristics of F-RAM ferroelectric capacitor 96. As a result, hybrid 1T1C reference signal fluctuates at an approximately same rate as the U term signal of F-RAM ferroelectric capacitors 96 as a function of temperature. Mgn0 may be maintained relatively constant and equal to the MOS component of hybrid 1T1C reference signal. As a result, Mgn1 may be maximized especially at high temperatures, such as over 85° C. In one embodiment, reference ferroelectric capacitors 204 may have the same structural features, including plate size, plate thickness, and building material, and ferroelectric layer size, thickness and material, as F-RAM ferroelectric capacitors 96. In one embodiment, one plate of each reference ferroelectric capacitor 204 receives Vcc, or other appropriate voltages. When Vcc is temporarily disconnected, each reference ferroelectric capacitor 204 may generate non-switching after term (Ua term) signal, or Da term signal if it is negative voltage. If reference ferroelectric capacitors 204 have a similar size and structure as F-RAM ferroelectric capacitors 96, the Ua term generated may match the U term of F-RAM ferroelectric capacitors 96. As a result, the ferroelectric component of hybrid 1T1C reference signal may follow a similar curve as U term signal of F-RAM ferroelectric capacitors 96 when plotting against temperature.

In one embodiment, reference ferroelectric capacitors 204 are programmable and may be programmed the same way as reference MOS capacitors 104, as discussed above using switches 206, and/or programming the magnitude of Vcc or voltage coupled to reference ferroelectric capacitors 204. It may be beneficial for reference ferroelectric capacitors 204 to be programmable because their Ua or Da term may only be partially utilized to generate the ferroelectric component of hybrid 1T1C reference signal due to charge sharing. F-RAM device 200 may have more reference ferroelectric capacitors 204 than F-RAM ferroelectric capacitors 96, such that the ferroelectric component of hybrid 1T1C reference signal would best match the U term signal of F-RAM ferroelectric capacitors 96. Besides, the ferroelectric component of hybrid 1T1C reference may be generated using the average of multiple reference ferroelectric capacitors 204 to ensure reliability of F-RAM device 200, in the event that some of the reference ferroelectric capacitors 204 become defective over time. In one embodiment, the hybrid 1T1C reference voltage that is generated by charge sharing of multiple reference MOS capacitors 104 and reference ferroelectric capacitors 204 may be averaged out for each of the multiple 1T1C F-RAM cells 90.

Figure 8:
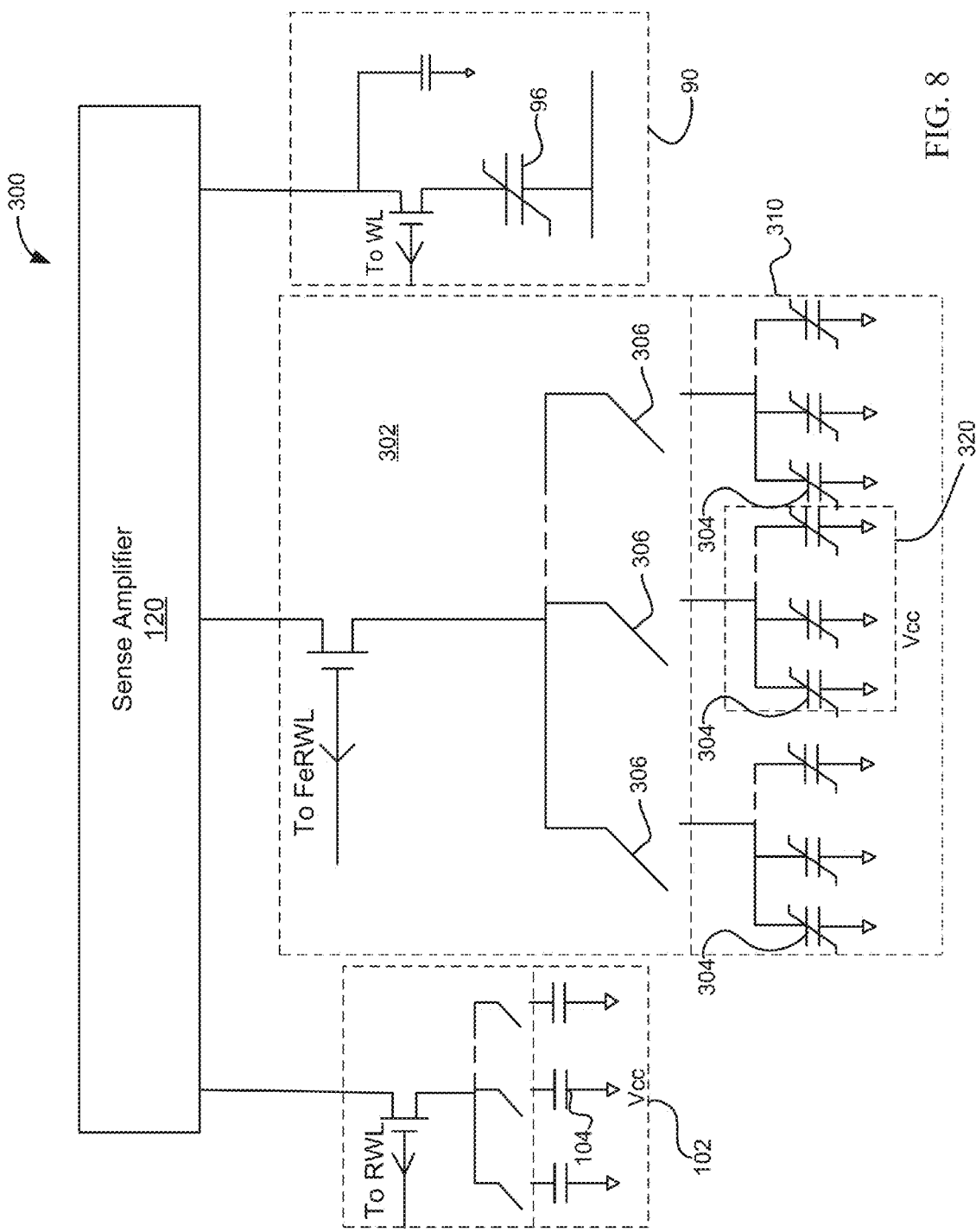
FIG. 8 is a schematic diagram illustrating a portion of an F-RAM device in accordance with another embodiment of the subject matter including a hybrid reference voltage generating array.

FIG. 8 is a schematic diagram illustrating a portion of hybrid F-RAM device 300 including hybrid reference voltage generating array/matrix 310. Similar to hybrid F-RAM device 200, hybrid F-RAM device 300 may include sense amplifier 120, at least one 1T1C F-RAM cell 90, and hybrid reference voltage generating array/matrix 310. In one embodiment, hybrid reference voltage generating matrix 310 includes MOS reference generating circuit 102 and ferroelectric reference generating circuit 302, which generate the hybrid 1T1C reference signal collectively or cumulatively. In ferroelectric reference generating circuit 302, there is at least one ferroelectric capacitor matrix 320. In one embodiment, multiple ferroelectric capacitor matrices 320 may be arranged in parallel and output of each ferroelectric capacitor matrix 320 is programmed by switch 306. In one embodiment, in each ferroelectric capacitor matrix 320, there may be at least one reference ferroelectric capacitor 304 arranged in parallel. The ferroelectric component of hybrid 1T1C reference signal may be generated by charge sharing among reference ferroelectric capacitors 304 in each ferroelectric capacitor matrix 320, then charge sharing among multiple ferroelectric capacitor matrices 320. Same as hybrid F-RAM device 200, both MOS reference generating circuit 102 and ferroelectric reference generating circuit 302 are programmable by switch 106 and 306, respectively.

Referring to FIGS. 7 and 8, both MOS reference generating circuit 102 and ferroelectric reference generating circuit 202 or 302 are programmable. In some embodiments, the MOS component and/or ferroelectric component of hybrid 1T1C reference voltage, or both may be blocked. Such embodiments may introduce flexibility in configuring hybrid F-RAM device 200 and 300.

It will be the understanding that hybrid reference generating circuits, such as those illustrated in FIGS. 7 and 8, may also be adopted to generate hybrid reference signals for 2T2C F-RAM cells (not shown) in some alternative embodiments.

Figure 9:
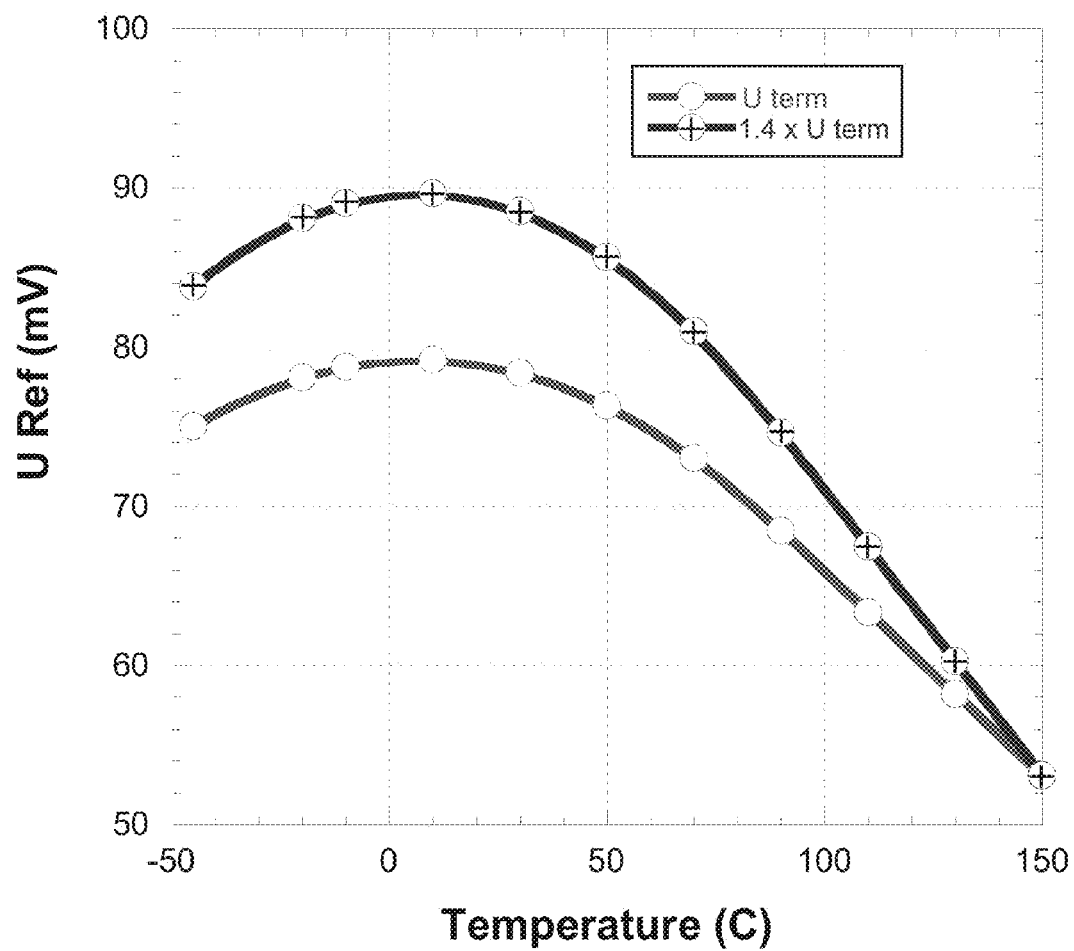
FIG. 9 is a diagram illustrating the effect of scaling factors in ferroelectric reference signals.

FIG. 9 is a diagram illustrating the effect of scaling factors in the ferroelectric component of hybrid 1T1C reference signal. As more ferroelectric capacitors, such as reference ferroelectric capacitors 204 and 304, are charge shared to generate the ferroelectric component of hybrid 1T1C reference signal, there may be a change of U term curvature when temperature rises, as shown in FIG. 9. Referring to FIG. 9, as an example, the ferroelectric component of hybrid 1T1C reference signal is set at 1.4×U term. It is observed that the ferroelectric component may have a higher decreasing rate than the U term. The change in curvature may also be more prominent when the scaling factor is large. Therefore, it may be important to have the relatively temperature independent MOS component in hybrid 1T1C reference signal such that Mgn0 is maintained above a minimum operational value, to ensure the end of life reliability of non-switching term data "0".

Figure 10:
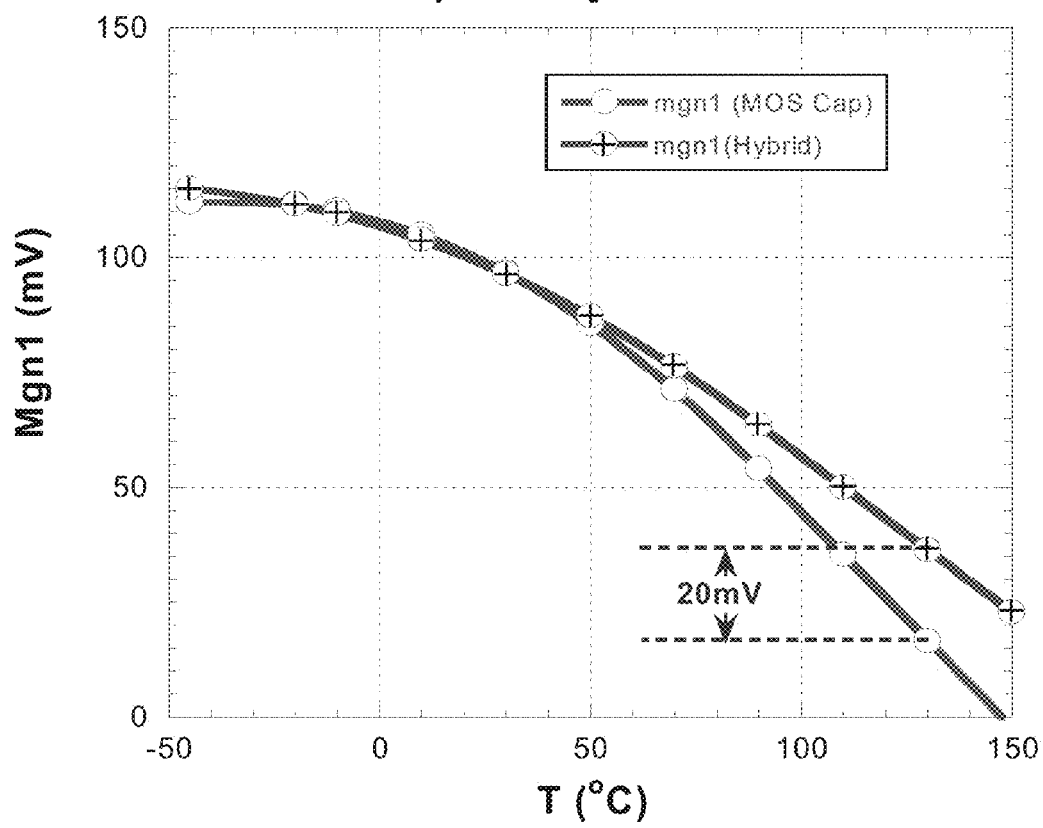
FIG. 10 is a diagram illustrating the relationship between 1T1C signal margins using a MOS capacitor array and a hybrid reference generating array as a function of temperature.

FIG. 10 is a diagram illustrating the relationship between Mgn1 using MOS capacitor only array and hybrid reference generating array, as a function of temperature. Referring to FIG. 10, Mgn1 for P term (data "1") reading is much improved when the temperature dependent ferroelectric component is incorporated to hybrid 1T1C reference signal, especially at high temperatures. As an example, it can be seen that at 130° C. with the proposed hybrid 1T1C reference signal, the Mgn1 is 36 mV, which is 20 mV higher than the MOS capacitor only reference signal. At 150 C, there is still 22 mV in 1T1C critical signal margin (mgn1=22 mV) for the hybrid 1T1C reference signal. Whereas there is no signal margin left at all for the MOS capacitor-only 1T1C reference signal.

Figure 11:
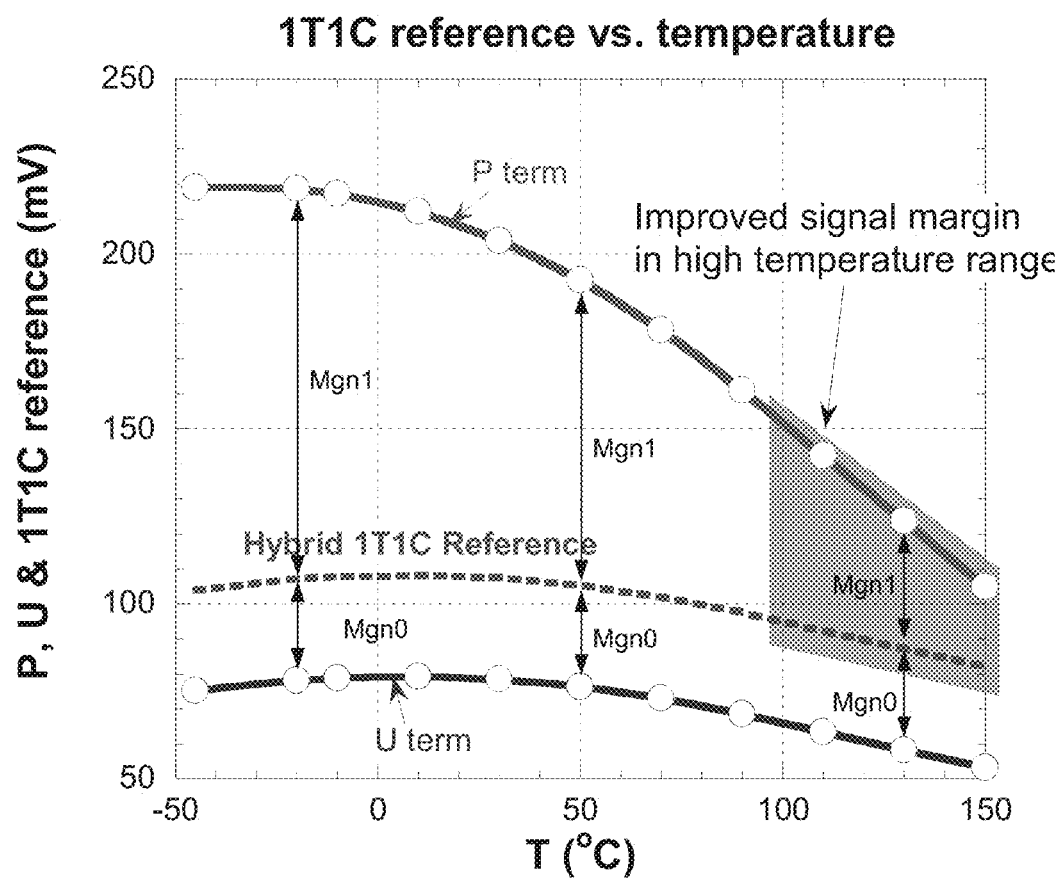
FIG. 11 is a diagram illustrating P term signal, U term signal, and hybrid 1T1C reference signal of hybrid F-RAM devices as a function of temperature.

FIG. 11 is a diagram illustrating P term signal, U term signal, and hybrid 1T1C reference signal of hybrid F-RAM devices as a function of temperature. As discussed, data stored in 1T1C F-RAM cells 96 may be considered "0" if hybrid 1T1C reference signal is greater than the output signal of 1T1C F-RAM cells 96, and "1" if hybrid 1T1C reference signal is smaller than the output signal of 1T1C F-RAM cells 96. Referring to FIG. 11, with the appropriate programming, the ferroelectric component of hybrid 1T1C reference signal tracks the change of U term signal of 1T1C F-RAM cells 90 as a function of temperature. In one embodiment, the programming may include consideration of scaling factor and charge sharing factor of ferroelectric reference generating circuit 202 and 302. As a result, Mgn0 may be maintained consistently at the minimum requirement (MOS component of hybrid 1T1C reference signal) for correct reading of data "0". In one embodiment, the remaining total signal margin contributes to maintaining an operational Mgn1 as the total signal margin continues to shrink, so as to ensure the end of life reliability of non-switching term signal read.

Figure 12A:
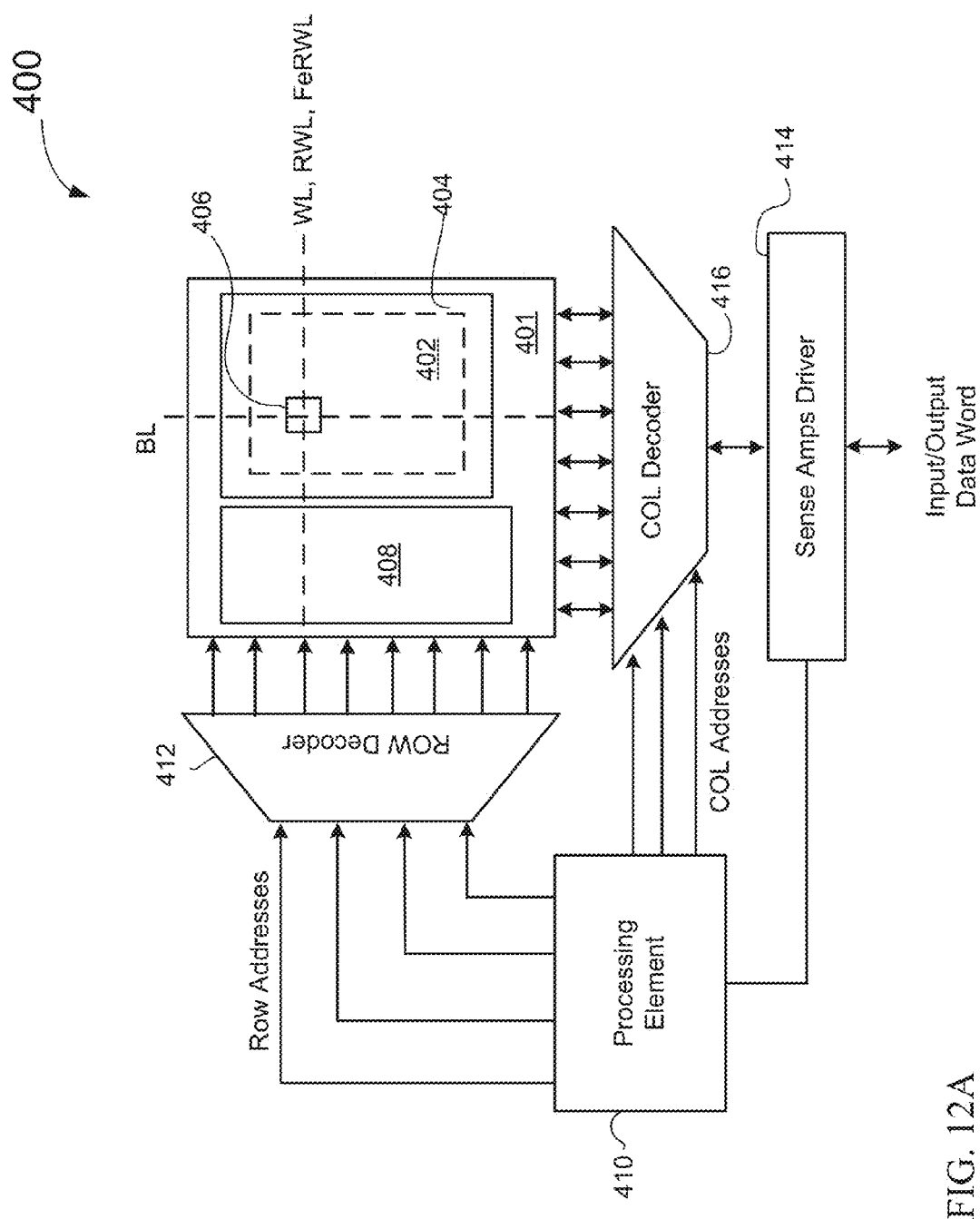
FIG. 12A is a schematic diagram illustrating a portion of a non-volatile memory system.

FIG. 12A is a block diagram of a semiconductor memory 400 including memory portion 401. Within memory portion 401, there is memory array 402 of non-volatile (NV) memory cells 406 arranged in a number of rows each sharing a common word-line (WL) and a number of columns each sharing a common bit-line. In one embodiment, NV memory cells 406 may be 1T1C F-RAM cells 90, or 2T2C F-RAM cells. In one embodiment, reference generating array 408, which includes MOS reference generating array, such as 102 and possibly ferroelectric reference generating array, such as 202 and 302, may also be disposed within memory portion 401. Referring to FIG. 12A, semiconductor memory 400 further includes processing element 410, such as a microcontroller, micro-processor or state machine. In one embodiment, processing element 410 may issue commands or control signals, such as WL, RWL, and FeRWL signals to each of the NV memory cells 406 and reference generating array 408 to execute read, erase and program operations as described above, and other peripheral circuits for reading from or writing to the memory array 402. The peripheral circuits include row decoder 412 to convert and apply a memory address to the word-lines of NV memory cells 406 of the memory array 402. When a data word is read from the semiconductor memory 400, NV memory cells 406 coupled to a selected word-line (WL) are read out to bit-line, and a state of those lines is detected by sense amplifier/driver 414. The column decoder 416 outputs the data from the bit-line onto sense amplifier/driver 414. In one embodiment, row and/or column decoder 412 and 416 may also convert and apply an address to the read word-lines (RWL) of MOS reference generating array and ferro read word-lines (FeRWL) of ferroelectric reference generating array to control the output of particular hybrid reference signal to sense amplifier/driver 414.

Possible ways to incorporate ferroelectric reference generating array including reference ferroelectric capacitors into semiconductor memory 400 will be discussed herein. In one embodiment, ferroelectric dummy capacitors in peripheral area 404 of memory array 402 may be utilized as reference ferroelectric capacitors to generate the ferroelectric component of hybrid reference signal. Alternatively, reference ferroelectric capacitors may utilize ferroelectric fill space on top of memory array 402. These embodiments may be applicable if the routing to sense amplifier 414 is relatively straight forward without introducing too much impact due to parasitic capacitance. In one alternative embodiment, ferroelectric reference generating array including reference ferroelectric capacitors are disposed beside the MOS reference generating array in reference generating array 408. To preserve the same die area, multiple reference MOS capacitors in the MOS reference generating array may be eliminated so that there is enough space to accommodate the reference ferroelectric capacitors in the ferroelectric reference generating array. There is a relatively large difference in dielectric constant between MOS capacitors and ferroelectric capacitors (approximately MOS capacitor 4 vs. ferroelectric capacitor 650) of the similar size. Therefore, freeing enough space to add enough reference ferroelectric capacitors to generate the ferroelectric component of hybrid reference signal may be achieved. It will be the understanding that FIG. 12A illustrates only one exemplary embodiment of semiconductor memory 400 including hybrid reference generating array 408. One benefit of having both MOS and ferroelectric reference generating arrays is to avoid variations in U-term signals of F-RAM cells due to temperature difference in different locations of the die.

In one alternative embodiment (not shown), a temperature sensor may be incorporated in an F-RAM system to address the temperature dependency issues of ferroelectric capacitors in F-RAM cells. The temperature sensor may be coupled to a programmable voltage regulator that generates reference voltage to a sense amplifier. The programmable voltage regulator may then adjust the reference voltage correspondingly to the temperature change.

Figure 12B:
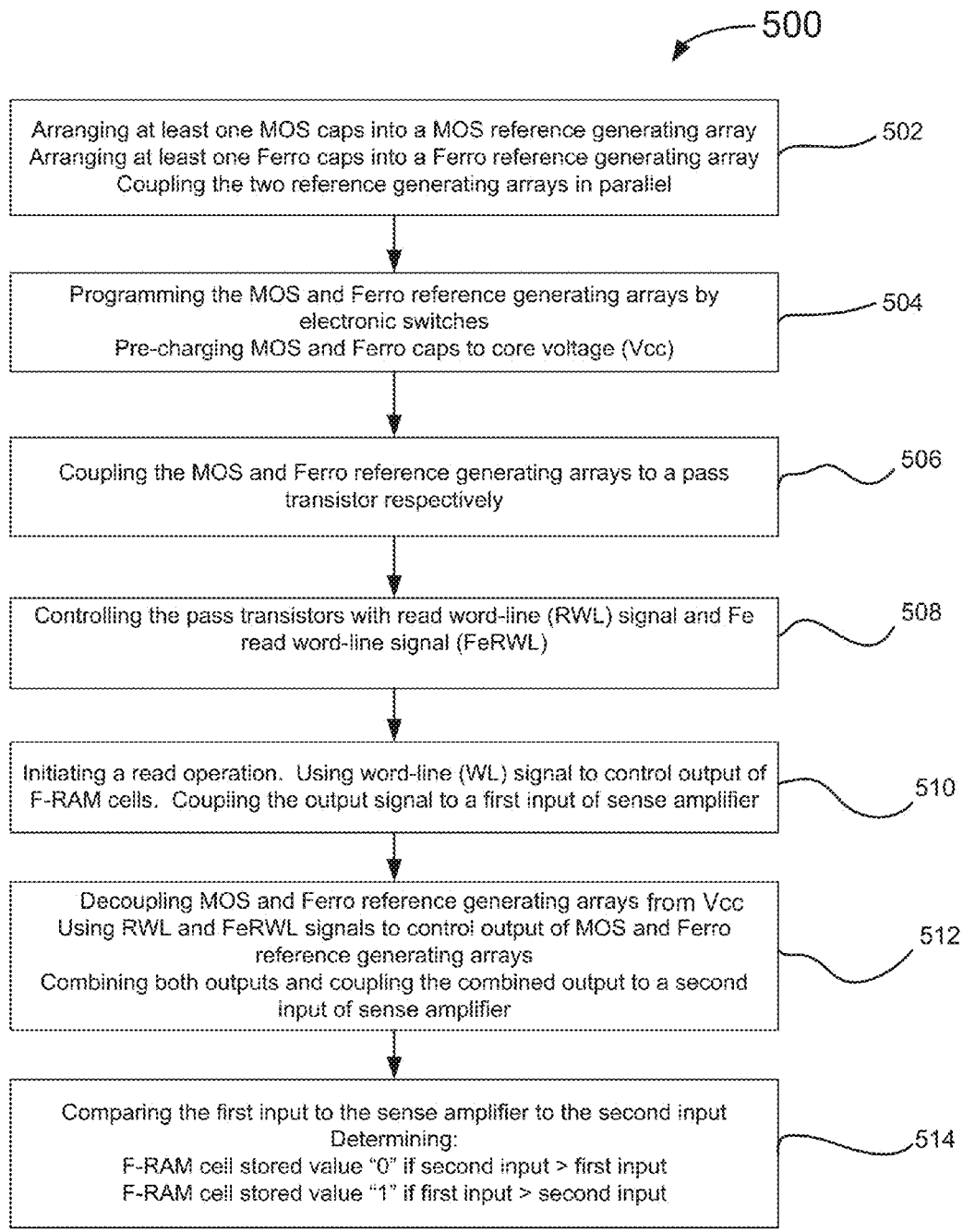
FIG. 12B is a representative flowchart including a method of operation for a hybrid 1T1C F-RAM device according to one embodiment of the subject matter.

FIG. 12B illustrates one embodiment of a method 500 of operating a hybrid 1T1C F-RAM device, such as hybrid F-RAM devices 200 and 300 illustrated in FIGS. 7 and 8. Solely for illustrative purposes, the steps illustrated in FIG. 12B are described with reference to example design and operation details illustrated in FIGS. 1-12A.

In step 502, MOS and ferroelectric reference generating arrays are arranged, such as illustrated in FIGS. 7 and 8. In step 504, both arrays are pre-charged to Vcc and programmed using switches. In steps 506 and 508, outputs of both arrays are controlled by RWL and FeRWL signals via their respective pass transistor. In step 510, when a read operation is initiated, stored signal in 1T1C F-RAM cells is output as a first input to a sense amplifier. The signal output of the 1T1C F-RAM cells is controlled by WL signal applied to each of its pass transistor. In step 512, MOS and ferroelectric reference generating arrays are decoupled from Vcc. Outputs of both arrays are then combined and coupled as a second input to the sense amplifier. In step 514, the sense amplifier may compare the two signals in its first and second input, and determine stored signal of 1T1C F-RAM cell is "1" if the first input is greater than the second input, and "0" if the second input is greater than the first input, or vice versa depending on the system configuration.

Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

In the foregoing specification, the subject matter has been described with reference to specific exemplary embodiments thereof. It will, however, be evident that various modifications and changes may be made thereto without departing from the broader spirit and scope of the subject matter as set forth in the appended claims. The specification and drawings are, accordingly, to be regarded in an illustrative sense rather than a restrictive sense.

What is claimed is:

1. An apparatus, comprising:
    a reference generating circuit configured to generate a reference signal for a non-volatile memory (NVM) device, the reference generating circuit including;
        a first circuit comprising at least one metal-oxide-semiconductor capacitor (MOS capacitor), the first circuit generating a first signal component of the reference signal, and
        a second circuit comprising at least one ferroelectric capacitor, the second circuit generating a second signal component of the reference signal, wherein the second signal component is temperature dependent.

2. The apparatus of claim 1, wherein temperature dependence of the second signal component of the reference signal corresponds with temperature characteristics of the NVM device.

3. The apparatus of claim 1, wherein the first and second circuits are coupled in parallel, configured to generate the reference signal cumulatively.

4. The apparatus of claim 1, wherein the first signal component generated by the first circuit and the second signal component generated by the second circuit are programmable by a plurality of switches.

5. The apparatus of claim 1, wherein the second circuit includes a ferroelectric capacitor array, the ferroelectric capacitor array comprising the at least one ferroelectric capacitor connected in parallel, and the second signal component is programmable by a plurality of switches.

6. The apparatus of claim 1, wherein the second circuit includes a plurality of ferroelectric capacitor arrays, each of the ferroelectric capacitor array comprising the at least one ferroelectric capacitor coupled in parallel, and wherein each of the ferroelectric capacitor array is coupled to one another in parallel, and the second signal component is programmable by a plurality of switches.

7. The apparatus of claim 1, wherein the NVM device comprises a ferroelectric random access memory (F-RAM) device including at least one memory ferroelectric capacitor.

8. The apparatus of claim 7, wherein the F-RAM device includes a one-transistor-one-capacitor (1T1C) configuration.

9. The apparatus of claim 7, wherein one of the plurality of memory ferroelectric capacitors of the F-RAM device and the at least one ferroelectric capacitor of the second circuit include approximately a same size.

10. The apparatus of claim 1, wherein the first signal component of the reference signal is generated by charge sharing of the at least one MOS capacitor, and the second signal component is generated by charge sharing of the at least one ferroelectric capacitor.

11. The apparatus of claim 7, wherein:
the second signal component of the reference signal is configured to be approximately equal to a non-switch term (U term) signal of the plurality of memory ferroelectric capacitors of the F-RAM device as a function of temperature; and
the first signal component of the reference signal is configured to provide an approximately constant margin between the reference signal of the reference circuit and the U term signal of the F-RAM device.

12. The apparatus of claim 1, wherein:
output of the first signal component of the reference signal is controlled by a first pass transistor, a gate of the first pass transistor is configured to be coupled to a read word-line signal; and
output of the second signal component of the reference signal is controlled by a second pass transistor, a gate of the second pass transistor is configured to be coupled to a ferroelectric word-line signal.

13. The apparatus of claim 1, wherein:
an output signal of the NVM device is configured to be coupled as a first input of a sense amplifier; and
the reference signal includes a sum of the first and second signal components, and is configured to be coupled as a second input of the sense amplifier.

14. The apparatus of claim 10, wherein the plurality of switches are configured to program a first quantity of the at least one MOS capacitor to generate the first signal component by charge sharing, and a second quantity of the at least one ferroelectric capacitor to generate the second signal component by charge sharing.

15. A method, comprising:
providing a reference generating circuit including a first circuit comprising at least one metal-oxide-semiconductor capacitor (MOS capacitor), and a second circuit comprising at least one ferroelectric capacitor;
coupling the first and second circuits in parallel;
generating, by the first circuit, a first signal component by charge sharing;
generating, by the second circuit, a second signal component by charge sharing;
generating a reference signal by incorporating the first and second signal components, and coupling the reference signal as a first input to a sense amplifier;
coupling a signal output of a non-volatile memory (NVM) device as a second input to the sense amplifier; and
outputting, by the sense amplifier, a first data value of the NVM device if the reference signal is greater than the signal output of the NVM device, and a second data value if the reference signal is smaller than the signal output of the NVM device.

16. The method of claim 15, wherein the NVM device includes a ferroelectric random access memory (F-RAM) comprising a one-transistor-one-capacitor (1T1C) configuration.

17. The method of claim 16, further comprising:
pre-charging the at least one MOS capacitor and the at least one ferroelectric capacitor to a pre-charge voltage;
configuring, using a plurality of switches, the at least one MOS capacitor and ferroelectric capacitor such that the second signal component is programmed to resemble a non-switching term (U term) signal of the F-RAM as a function of temperature, and the first signal component provides a relatively temperature independent margin between the reference signal and the U term signal; and
configuring magnitude of the pre-charge voltage.

18. A system, comprising:
a processing element;
a memory portion including multiple one-transistor-one-capacitor (1T1C) ferroelectric random access memory (F-RAM) cells arranged in rows and columns;
a hybrid reference generator comprising,
a metal-oxide-semiconductor (MOS) circuit including at least one MOS capacitor, wherein the MOS circuit generates a first signal component of a reference signal that does not vary significantly as a function of temperature, and
a ferroelectric circuit including at least one ferroelectric capacitor, the ferroelectric circuit generating a second signal component of the reference signal that is temperature dependent;
bit-lines, wherein 1T1C F-RAM cells of a same column share one of the bit-lines; and
a sense amplifier coupled to the 1T1C F-RAM cells via the bit-lines, wherein the sense amplifier is configured to receive signal outputs of the 1T1C F-RAM cells as a first input and the reference signal from the hybrid reference generator as a second input.

19. The system of claim 18, wherein the at least one ferroelectric capacitor of the ferroelectric circuit is disposed in a periphery area of the memory portion, and wherein the at least one ferroelectric capacitor is substantially identical to memory ferroelectric capacitors in the 1T1C F-RAM cells.

20. The system of claim 18, wherein the at least one ferroelectric capacitor of the ferroelectric circuit is disposed adjacent to the MOS circuit, and wherein the at least one ferroelectric capacitor replaces some of the at least one MOS capacitor to preserve die area.

* * * * *